(12) United States Patent
Hong et al.

(10) Patent No.: US 8,115,546 B2
(45) Date of Patent: Feb. 14, 2012

(54) APPARATUS AND METHOD FOR MAXIMIZING PERFORMANCE OF PEAKING AMPLIFIER IN DOHERTY AMPLIFIER

(75) Inventors: Sung-Chul Hong, Hwaseong-si (KR); Young-Yoon Woo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 86 days.

(21) Appl. No.: 12/779,327

(22) Filed: May 13, 2010

(65) Prior Publication Data

US 2010/0289571 A1 Nov. 18, 2010

(30) Foreign Application Priority Data

May 15, 2009 (KR) .................. 10-2009-0042567
May 10, 2010 (KR) .................. 10-2010-0043343

(51) Int. Cl.
*H03F 3/68* (2006.01)
(52) U.S. Cl. .................. 330/124 R; 330/295; 330/53
(58) Field of Classification Search .............. 330/124 R, 330/295, 53
See application file for complete search history.

(56) References Cited

U.S. PATENT DOCUMENTS

| | | | | |
|---|---|---|---|---|
| 5,568,086 A | * | 10/1996 | Schuss et al. | 330/124 R |
| 7,342,444 B2 | * | 3/2008 | Kim et al. | 330/124 R |
| 7,602,241 B2 | * | 10/2009 | Suzuki et al. | 330/124 R |
| 7,649,412 B2 | * | 1/2010 | Horiguchi et al. | 330/124 R |
| 2011/0025412 A1 | * | 2/2011 | Matsunaga | 330/124 R |

FOREIGN PATENT DOCUMENTS

KR 10-2010-0123615 A 11/2010

* cited by examiner

*Primary Examiner* — Patricia Nguyen
(74) *Attorney, Agent, or Firm* — Jefferson IP Law, LLP (57) ABSTRACT

An apparatus and method for maximizing the performance of a peaking amplifier in a Doherty amplifier are provided. The apparatus includes a splitter, a carrier amplifier, an (N−1) number of peaking amplifiers, a Doherty combiner, and an output load. The splitter splits an input signal into an 'N' number of power signals. The carrier amplifier amplifies the signal provided from the splitter using a first Direct Current (DC) bias. The peaking amplifiers amplify the signals provided from the splitter using a second DC bias, which is lower than the first DC bias. When the carrier amplifier and the peaking amplifiers are all operating, the Doherty combiner forms a load impedance of the respective amplifiers such that the load impedance of the peaking amplifiers are less than the load impedance of the carrier amplifier. The output load outputs the signals amplified by the carrier amplifier and the peaking amplifiers.

24 Claims, 10 Drawing Sheets

FIG.6

APPARATUS AND METHOD FOR MAXIMIZING PERFORMANCE OF PEAKING AMPLIFIER IN DOHERTY AMPLIFIER

PRIORITY

This application claims the benefit under 35 U.S.C. §119(a) of a Korean patent application filed in the Korean Intellectual Property Office on May 15, 2009 and assigned Serial No. 10-2009-0042567 and a Korean patent application filed in the Korean Intellectual Property Office on May 10, 2010 and assigned Serial No. 10-2010-0043343, the entire disclosures of which are hereby incorporated by reference.

BACKGROUND OF THE INVENTION

1. Field of the Invention

Aspects of the present invention relate to a Doherty amplifier. More particularly, aspects of the present invention relate to an apparatus and method for improving the overall performance of a Doherty amplifier by maximizing the performance of a peaking amplifier in the Doherty amplifier.

2. Description of the Related Art

In a wireless communication system, transmission signals of a Base Station (BS) and a Mobile Station (MS) are forwarded through a wireless channel. Because of this, the transmission signals suffer heavy attenuation. To compensate for the attenuation, transmitters of the BS and the MS amplify the transmission signals. Thus, amplification is the function of a transmitter that is most responsible for an improvement in a quality of communication.

A Doherty amplifier is one of various types of amplifiers used for an amplification function of the transmitter. The Doherty amplifier is comprised of a carrier amplifier and a peaking amplifier. The carrier amplifier and the peaking amplifier use a Direct Current (DC) bias of a different magnitude, so they operate at a different range of an input signal. That is, the carrier amplifier and the peaking amplifier are amplifiers of different classes. For instance, the carrier amplifier may be a class 'A' or 'AB' amplifier, and the peaking amplifier may be a class 'C' amplifier.

Figure 1A:
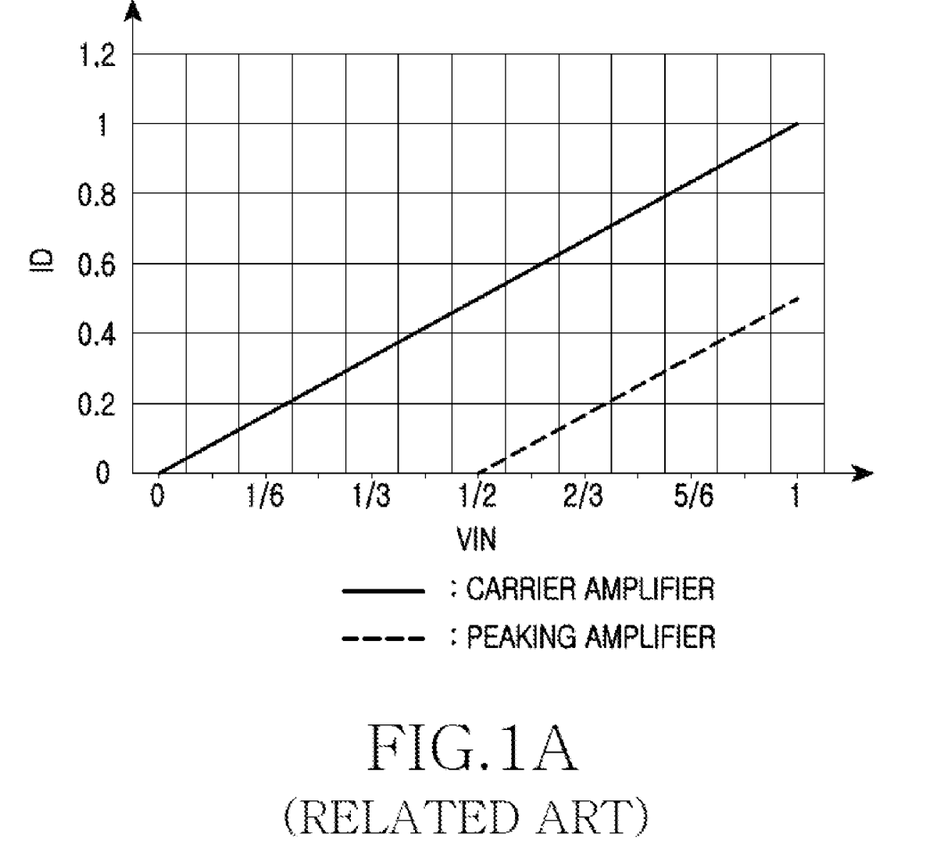
FIG. 1A is a graph illustrating a relationship between an input signal and an output signal in a Doherty amplifier according to the related art.

When the carrier amplifier uses a DC bias that is higher than the peaking amplifier, the carrier amplifier and the peaking amplifier constituting the Doherty amplifier may have inputs/outputs as illustrated in FIG. 1A.

FIG. 1A illustrates a relationship between an input signal and an output signal in a Doherty amplifier according to the related art. In FIG. 1A, the horizontal axis represents an input voltage, and vertical axis represents an output current.

Referring to FIG. 1A, a carrier amplifier of a Doherty amplifier of the related art is shown as having an input/output relationship, represented by a solid line, in which a maximum output is achieved at maximum input. In contrast, a peaking amplifier is shown as having an input/output relationship, represented by a dashed line, in which a maximum output is not achieved, even at maximum input. In more detail, the carrier amplifier uses a high DC bias and thus, operates in response to a low input signal. In contrast, the peaking amplifier uses a low DC bias and thus, only operates in response to an input signal of a threshold or more. In more detail, at an input of less than the threshold, the Doherty amplifier operates using only the carrier amplifier and, at an input higher than the threshold, the Doherty amplifier simultaneously operates both the carrier amplifier and the peaking amplifier, thus amplifying a modulation signal having a high Peak to Average Ratio (PAR) at high drain efficiency. Because the peaking amplifier applies a lower input DC bias than the carrier amplifier and thus is different in its bias point, the peaking amplifier cannot reach the maximum output if the peaking amplifier uses the same output load as the carrier amplifier.

As described above, the Doherty amplifier generates an output lower than a sum of the maximum outputs of the respective carrier amplifier and peaking amplifier. Thus, the Doherty amplifier has a problem of not only causing a decrease of the maximum output, but a deterioration of a high drain efficiency operating region.

Therefore, a need exists for an apparatus and method for maximizing performance of a peaking amplifier in a Doherty amplifier.

SUMMARY OF THE INVENTION

An aspect of the present invention is to address at least the above-mentioned problems and/or disadvantages and to provide at least the advantages described below. Accordingly, an aspect of the present invention is to provide an apparatus and method for increasing the maximum output of a Doherty amplifier.

Another aspect of the present invention is to provide an apparatus and method for maximizing an output of a peaking amplifier in a Doherty amplifier.

A further aspect of the present invention is to provide an apparatus and method for making a load impedance of a carrier amplifier and a load impedance of a peaking amplifier different when the carrier amplifier and the peaking amplifier are both operating in a Doherty amplifier.

A further aspect of the present invention is to provide an apparatus and method for inducing the maximum output of each of a carrier amplifier and a peaking amplifier in a Doherty amplifier.

The above aspects are addressed by providing an apparatus and method for maximizing the performance of a peaking amplifier in a Doherty amplifier.

In accordance with an aspect of the present invention, a Doherty amplifier apparatus is provided. The apparatus includes a splitter, a carrier amplifier, an (N−1) number of peaking amplifiers, a Doherty combiner, and an output load. The splitter splits an input signal into an 'N' number of power signals. The carrier amplifier amplifies the signal provided from the splitter using a first Direct Current (DC) bias. The (N−1) number of peaking amplifiers amplifies the signals provided from the splitter using a second DC bias, which is lower than the first DC bias. When the carrier amplifier and the (N−1) number of peaking amplifiers are all operating, the Doherty combiner forms a load impedance of the respective amplifiers such that the load impedance of the (N−1) number of peaking amplifiers are less than the load impedance of the carrier amplifier. The output load outputs the signals amplified by the carrier amplifier and the (N−1) number of peaking amplifiers. The 'N' is equal to an integer of '2' or more.

In accordance with another aspect of the present invention, an operation method of a Doherty amplifier is provided. The method includes splitting an input signal into an 'N' number of power signals, amplifying one of the split signals through a carrier amplifier operating using a first DC bias, amplifying an (N−1) number of split signals through an (N−1) number of peaking amplifiers operating using a second DC bias lower than the first DC bias, when the carrier amplifier and the (N−1) number of peaking amplifiers all are operating, forming a load impedance of the respective amplifiers such that the load impedance of the (N−1) number of the peaking amplifiers are less than the load impedance of the carrier amplifier, and outputting the signals, which are amplified by the carrier amplifier and the (N−1) number of peaking amplifiers, through an output load. The 'N' is equal to an integer of '2' or more.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will become more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention are provided for purposes of illustration only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

A technology for maximizing an output of a peaking amplifier within a Doherty amplifier according to exemplary embodiments of the present invention is described below. An example of maximizing an output of a peaking amplifier within a Doherty amplifier is described below with reference to FIG. 1B.

Figure 1B:
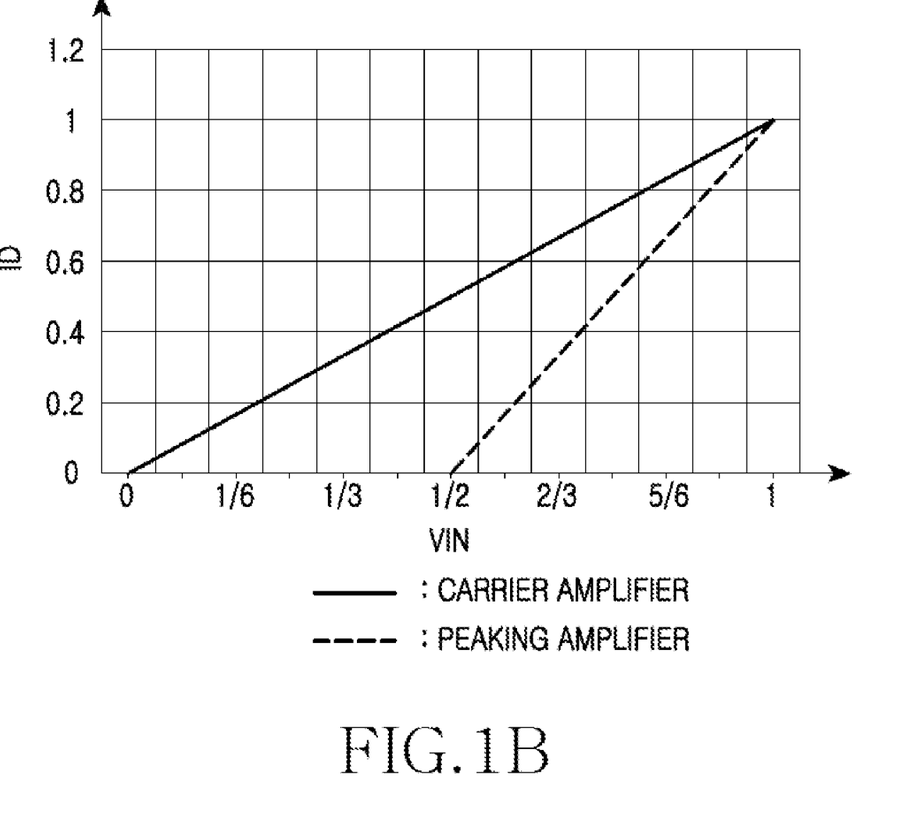
FIG. 1B is a graph illustrating a relationship between an input signal and an output signal in a Doherty amplifier according to an exemplary embodiment of the present invention.

FIG. 1B is a graph illustrating a relationship between an input signal and an output signal in a Doherty amplifier according to an exemplary embodiment of the present invention.

Referring to FIG. 1B, a carrier amplifier of a Doherty amplifier according to an exemplary embodiment of the present invention is shown as having an input/output relationship, represented by a solid line, in which a maximum output is achieved at maximum input. Likewise, a peaking amplifier is shown has having an input/output relationship, represented by a dashed line, in which a maximum output is achieved at the maximum input. Here, the carrier amplifier uses a high DC bias and thus, operates in response to a low input signal. In contrast, the peaking amplifier uses a low DC bias and thus, only operates in response to an input signal of a threshold or more.

Described below is a technology for enabling the carrier amplifier and the peaking amplifier within the Doherty amplifier to have an input/output relationship as illustrated in FIG. 1B. Further, described below is a technology for constructing a Doherty amplifier that addresses the problem illustrated in FIG. 1A, namely a peaking amplifier that fails to reach the maximum output at a time a carrier amplifier is at maximum output, by enabling both the carrier amplifier and the peaking amplifier to reach the maximum output, as illustrated in FIG. 1B.

Figure 2:
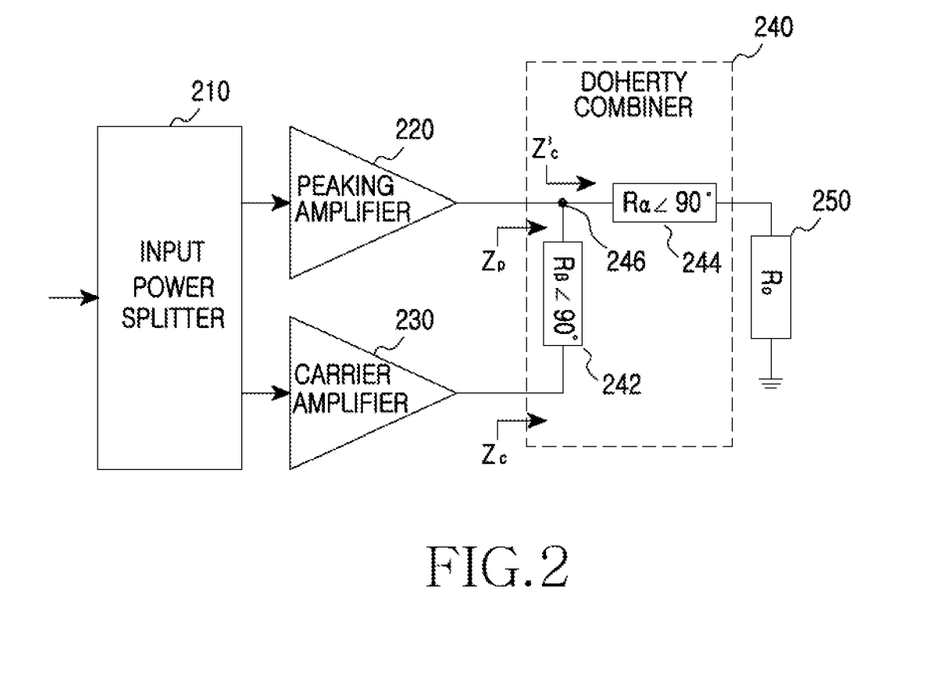
FIG. 2 is a circuit diagram illustrating a structure of a Doherty amplifier according to an exemplary embodiment of the present invention.

FIG. 2 illustrates a structure of a Doherty amplifier according to an exemplary embodiment of the present invention.

Referring to FIG. 2, the Doherty amplifier includes an input power splitter 210, a peaking amplifier 220, a carrier amplifier 230, a Doherty combiner 240, and an output load 250.

The input power splitter 210 splits a signal input to the Doherty amplifier into two power signals, and provides one of the two power signals to the peaking amplifier 220 and other of the two power signals to the carrier amplifier 230. At this time, the two power signals have a phase difference of 90°. For instance, the input power splitter 210 can include at least one of a Wilkinson divider and a coupler. However, when the Wilkinson divider is used as the input power splitter 210, because the Wilkinson divider outputs signals of the same phase, the input power splitter 210 further includes a construction for generating a phase difference of 90° between the two signals by controlling a phase of at least one of the two signals.

The peaking amplifier 220 and the carrier amplifier 230 are power amplifiers that make use of DC biases. The carrier amplifier 230 uses a higher DC bias than the peaking amplifier 220. Thus, the minimum value of an input signal power at which the peaking amplifier 220 operates is higher than the minimum value of an input signal power at which the carrier amplifier 230 operates. In more detail, if an input signal having power of less than a threshold for operating the peaking amplifier 220 is applied, only the carrier amplifier 230 operates. In this case, the peaking amplifier 220 is in a state that corresponds to an open circuit.

The Doherty combiner 240 forms a load impedance of the peaking amplifier 220 and the carrier amplifier 230 using a first impedance transformer line 242 having a characteristic impedance of $R_\beta \angle 90°$ and a second impedance transformer line 244 having a characteristic impedance of $R_\alpha \phi 90°$. The first impedance transformer line 242 connects with an output terminal of the carrier amplifier 230, and the second impedance transformer line 244 connects with an output terminal of the peaking amplifier 220. The first impedance transformer line 242 and the second impedance transformer line 244 connect with each other through a node A 246, which is disposed at the output terminal of the peaking amplifier 220. The load impedance values of the peaking amplifier 220 and the carrier amplifier 230, which are formed by the Doherty combiner 240, are varied according to a state of the peaking amplifier 220. Here, unlike the illustration of FIG. 2, the first impedance transformer line 242 and second impedance transformer line 244 of the Doherty combiner 240 may include at least one of a resistor, an inductor, and a capacitor. The output load 250 outputs an amplified signal, and has an impedance of $R_0$.

Figure 3A:
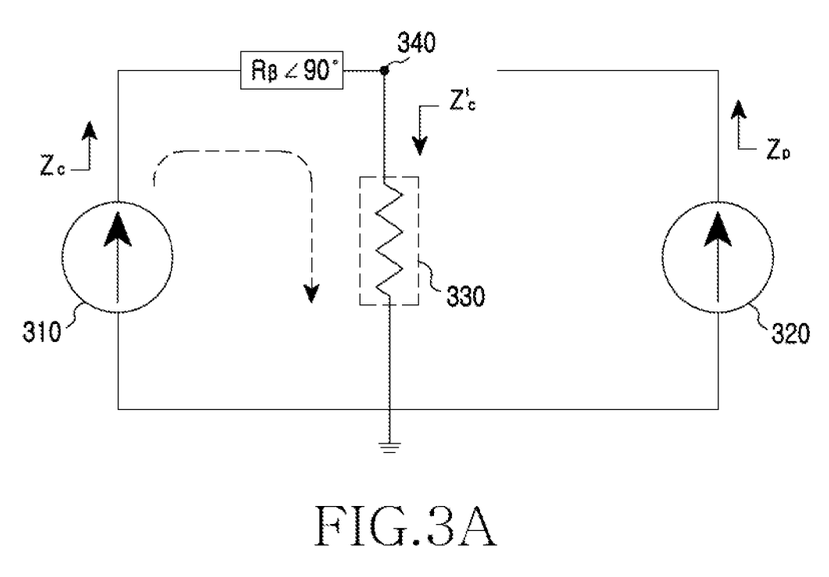
FIGS. 3A and 3B are circuit diagrams illustrating an operation of a Doherty combiner of a Doherty amplifier according to an exemplary embodiment of the present invention.
Figure 3B:
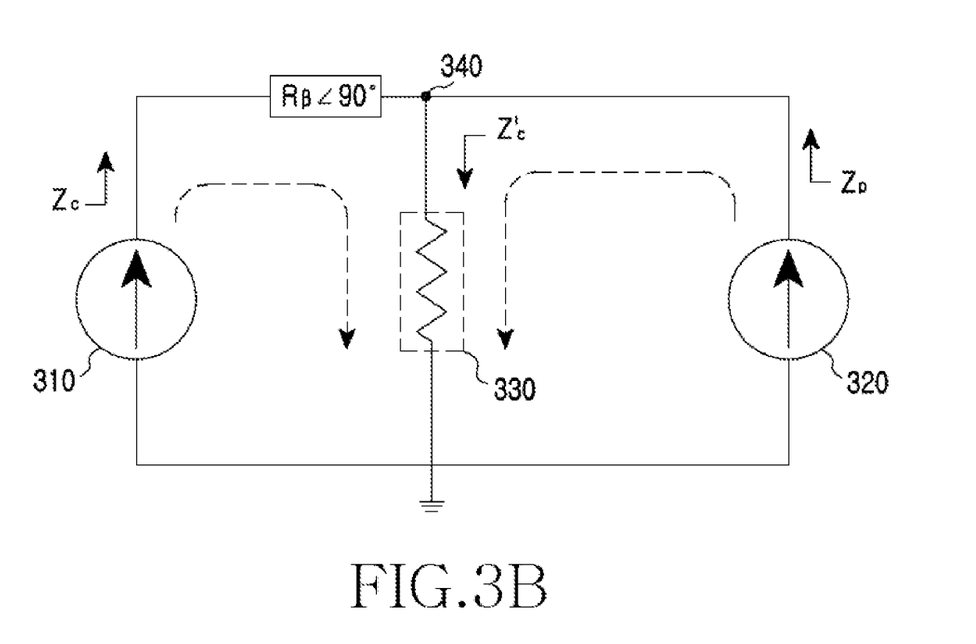

FIGS. 3A and 3B illustrate expressions of functions of the Doherty combiner 240 using equivalent circuits. FIGS. 3A and 3B illustrate equivalent circuits corresponding to ideal operations of the Doherty combiner 240 according to an exemplary embodiment of the present invention.

Referring to FIGS. 3A and 3B, the ideal operation of the Doherty combiner 240 is that the peaking amplifier 220 and the carrier amplifier 230 each operate like current sources 310 and 320, and the current sources 310 and 320 supply electric currents to an output combination load 330. Here, the output combination load 330 includes the second impedance transformer line 244 and the output load 250.

When the power of an input signal is less than the threshold, only the carrier current source 310 operates and the peaking current source 320 does not operate, as illustrated in FIG. 3A. Thus, an output terminal load impedance ($Z'_c$) of a combination point 340 becomes equal to the output combination load 330. Here, the combination point 340 corresponds to the node A 246. On the contrary, when the power of an input signal is equal to or greater than the threshold, both the carrier current source 310 and the peaking current source 320 operate, as illustrated in FIG. 3B. Accordingly, at maximum output, the output terminal load impedance ($Z'_c$) of the combination point 340 of FIG. 3B becomes greater than the output combination load 330 illustrated in FIG. 3A. The process of modulating the load impedance as described above is referred to as 'load modulation'.

Referring back to FIG. 2, the first impedance transformer line 242 is disposed between the node A 246 and the carrier amplifier 230, thereby causing the load modulation. As a result of the load modulation operation and the first impedance transformer line 242, at maximum output and at low output, the load impedance of the carrier amplifier 230 and the peaking amplifier 220 are controlled. Here, a value of the load impedance determines a range of an output signal with respect to a range of an input signal. For example, when the load impedance ($Z_p$) of the peaking amplifier 220 is substantially the same as the load impedance ($Z_c$) of the carrier amplifier 230, a range of the output signal is as illustrated in FIG. 4A.

Figure 4A:
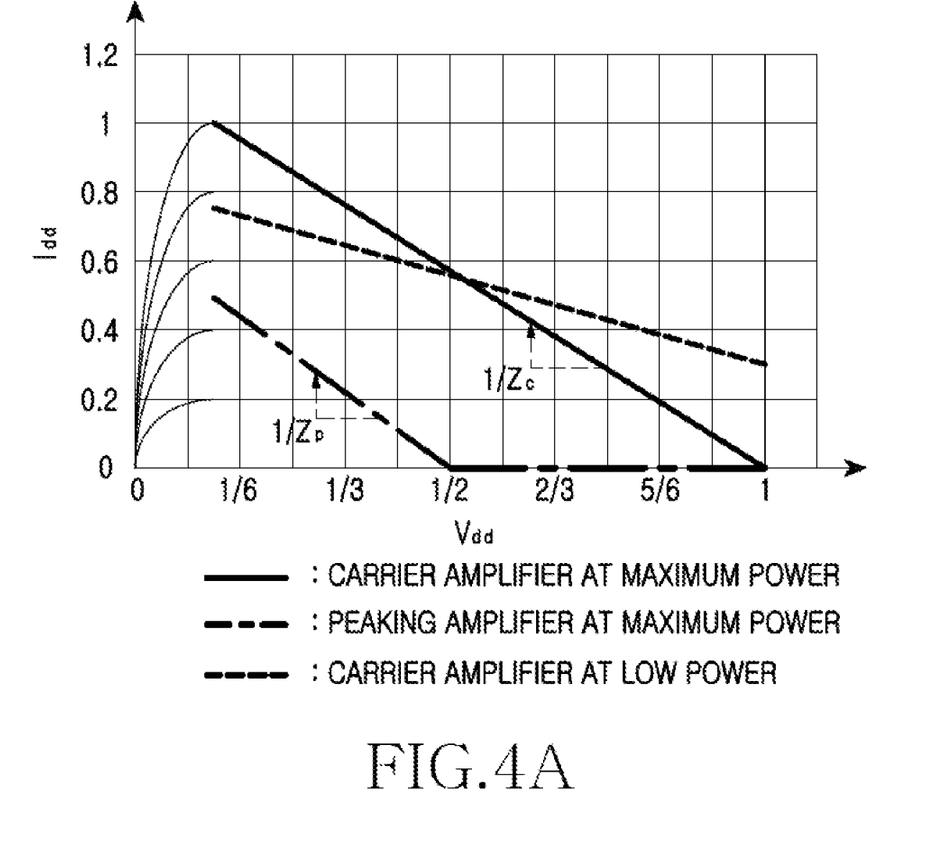
FIG. 4A is a graph illustrating characteristics of a carrier amplifier and a peaking amplifier in a Doherty amplifier in which load impedance of the carrier amplifier and the peaking amplifier are uniform at maximum output according to an exemplary embodiment of the present invention.

FIG. 4A is a graph illustrating characteristics of a carrier amplifier and a peaking amplifier in a Doherty amplifier in which load impedance of the carrier amplifier and the peaking amplifier are uniform at maximum output according to an exemplary embodiment of the present invention.

Figure 4B:
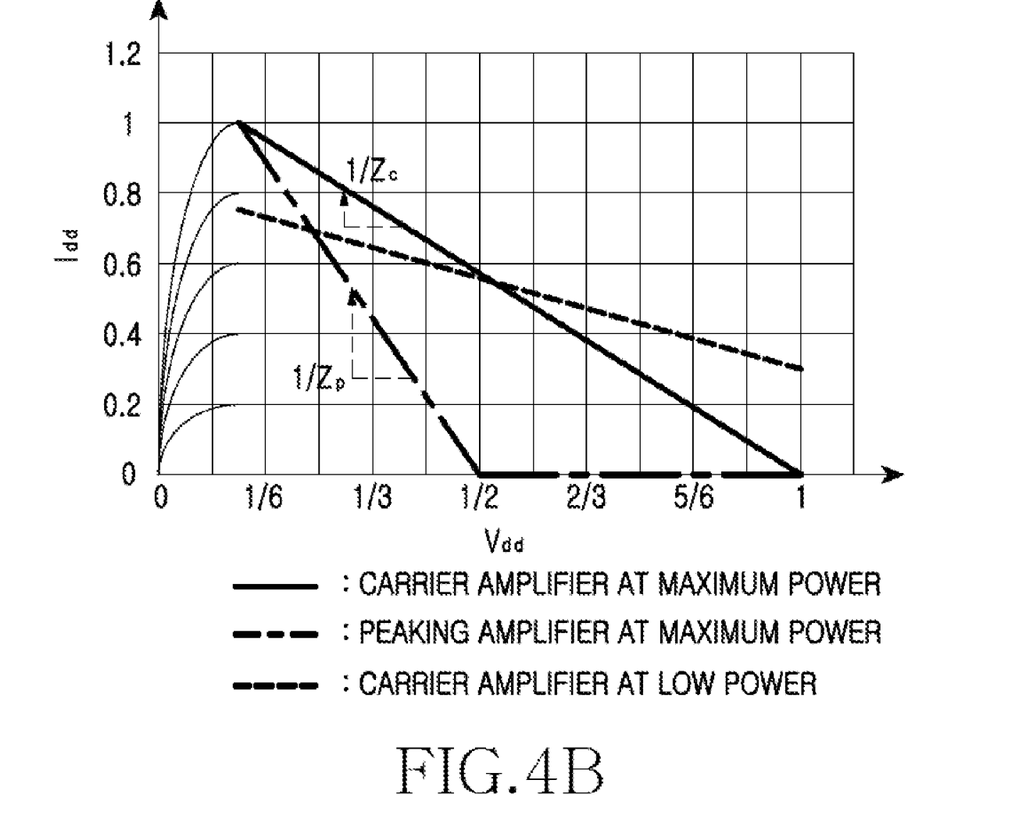
FIG. 4B is a graph illustrating characteristics of a carrier amplifier and a peaking amplifier in a Doherty amplifier according to an exemplary embodiment of the present invention.

In contrast, when the load impedance ($Z_p$) of the peaking amplifier 220 is less than the load impedance ($Z_c$) of the carrier amplifier 230, a range of the output signal is as illustrated in FIG. 4B.

FIG. 4B is a graph illustrating characteristics of a carrier amplifier and a peaking amplifier in a Doherty amplifier according to an exemplary embodiment of the present invention.

Referring to FIGS. 4A and 4B, the horizontal axis ($V_{dd}$) represents an output voltage, and the vertical axis ($I_{dd}$) represents an output current. The output voltage and the output current have a phase difference of about 180° and thus, can form substantially a straight line with a specific slope if voltage and current states of every moment are illustrated. The straight line is referred to as a 'load line'. The slope of the straight line represents inverse number values of the load impedance ($Z_c$) and ($Z_p$) of the carrier amplifier 230 and the peaking amplifier 220. Thus, a load impedance value of a corresponding amplifier may be identified through the slope of the load line, and the producible maximum output power of the corresponding amplifier is identified through the maximum voltage value and the maximum current value on a locus of the load line passing. In a comparison of FIG. 4B with FIG. 4A, it can be identified that the load impedance ($Z_p$) of the peaking amplifier 230 decreases. At this time, it is observed that the maximum voltage value is unchanged and the maximum current value is doubled. This shows that the maximum output increases as the load impedance ($Z_p$) of the peaking amplifier 220 is less than the load impedance ($Z_c$) of the carrier amplifier 230.

Thus, in exemplary embodiments of the present invention, the Doherty combiner 240 is constructed such that, at maximum output, the load impedance ($Z_p$) of the peaking amplifier 220 is less than the load impedance ($Z_c$) of the carrier amplifier 230. In more detail, the Doherty amplifier using one peaking amplifier according to an exemplary embodiment of the present invention induces the maximum output of the peaking amplifier 220 by, at low output, making the load impedance ($Z_c$) of the carrier amplifier 230 become a double of the impedance ($R_0$) of the output load 250 and, at maximum output, making the load impedance ($Z_c$) of the carrier amplifier 230 be equal to the impedance ($R_0$) of the output load 250 and simultaneously making the load impedance ($Z_p$) of the peaking amplifier 220 less than the load impedance ($Z_c$) of the carrier amplifier 230. Accordingly, when the load impedance ($Z_p$) of the peaking amplifier 220 is equal to the load impedance ($Z_c$) of the carrier amplifier 230, a loss is made in a partial region of the vicinity of the maximum power as illustrated in FIG. 5A, while, according to an exemplary embodiment of the present invention, the Doherty amplifier is operable at high drain efficiency with no loss in a region ranging from a maximum output to −6 dB, which is (−20×log (2)), as illustrated in FIG. 5B.

Figure 5A:
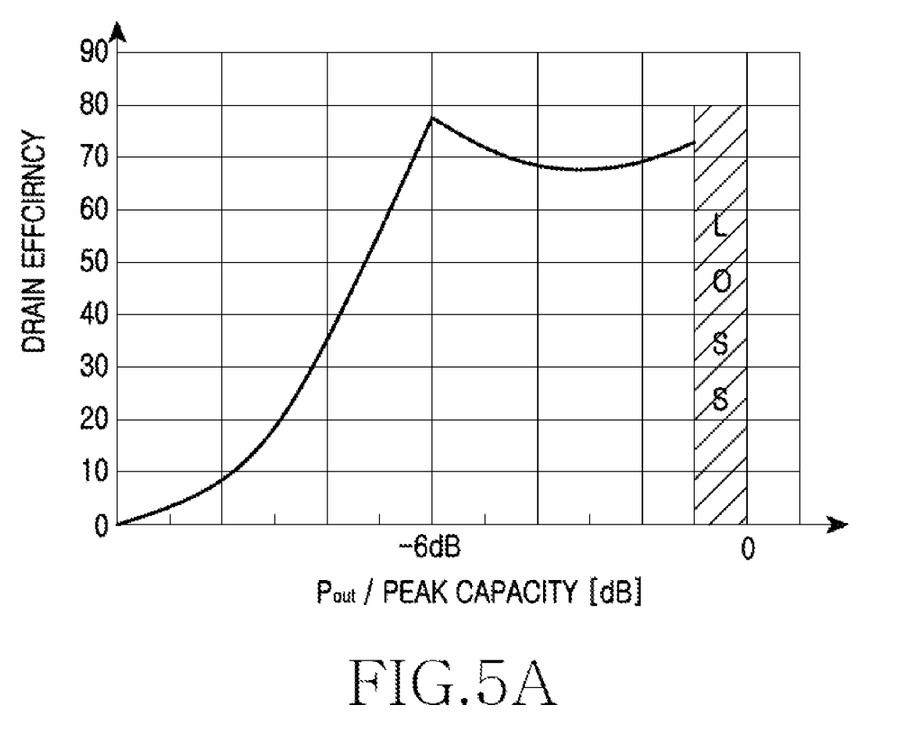
FIG. 5A is a graph illustrating the performance of a 2-way Doherty amplifier in which load impedance of a carrier amplifier and a peaking amplifier are uniform at maximum output according to an exemplary embodiment of the present invention.
Figure 5B:
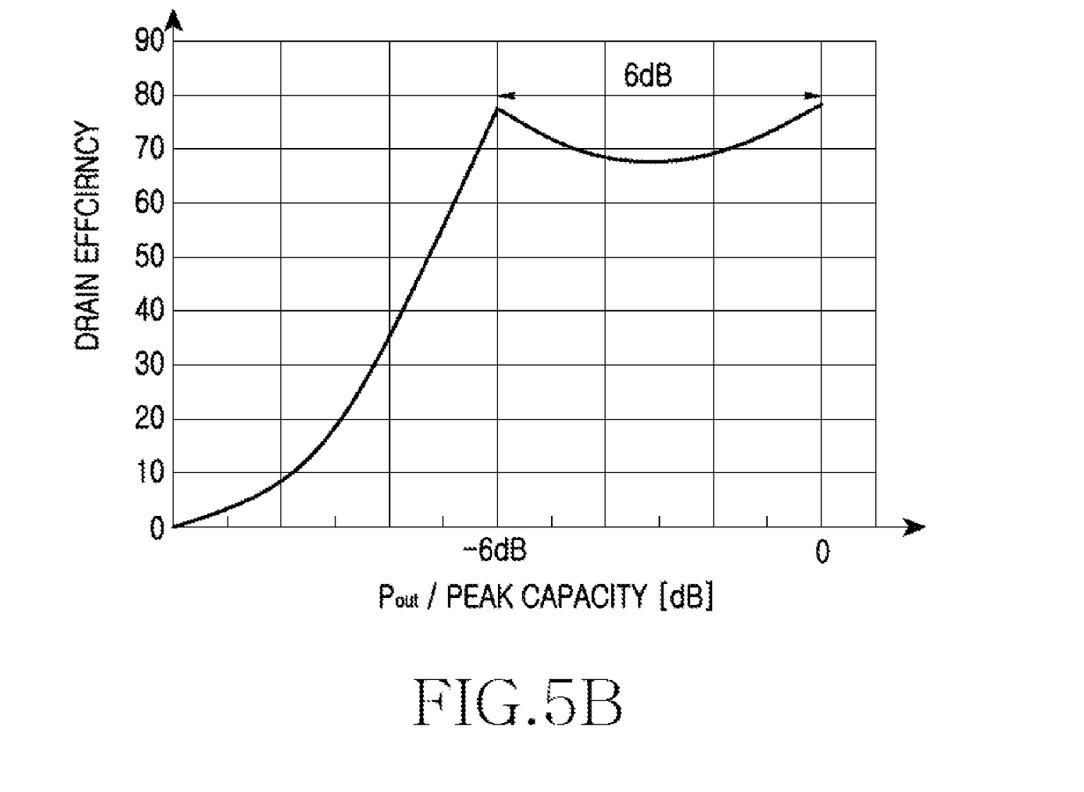
FIG. 5B is a graph illustrating the performance of a 2-way Doherty amplifier according to an exemplary embodiment of the present invention.

FIG. 5A is a graph illustrating the performance of a 2-way Doherty amplifier in which load impedance of a carrier amplifier and a peaking amplifier are uniform at maximum output according to an exemplary embodiment of the present invention. FIG. 5B is a graph illustrating the performance of a 2-way Doherty amplifier according to an exemplary embodiment of the present invention Here, the characteristic impedance ($R_\beta$) of the first impedance transformer line 242 should be set less than the impedance ($R_0$) of the output load 250, and the characteristic impedance ($R_\alpha$) of the second impedance transformer line 244 should be set less than a value obtained by dividing the impedance ($R_0$) of the output load 250 by $\sqrt{2}$. This is because an impedance of a combination load has to be equal to '$R_0/2$', such that, as a result of load modulation at high output, the load impedance ($Z_c$) of the carrier amplifier 230 including the first impedance transformer line 242 is equal to the '$R_0$'.

At this time, detailed values of the characteristic impedance ($R_\beta$) of the first impedance transformer line 242 and the characteristic impedance ($R_\alpha$) of the second impedance transformer line 244 may be determined as follows.

First, an exemplary embodiment of the present invention defines a ratio of load impedance of the peaking amplifier 220 to load impedance of the carrier amplifier 230 at maximum output as in Equation 1 below.

$$u = \frac{\text{(peaking load impedance at maximum output)}}{\text{(carrier load impedance at maximum output)}} \quad (1)$$

In Equation 1, 'u' represents a ratio of load impedance of a peaking amplifier 220 to load impedance of a carrier amplifier 230 at maximum output, 'peaking load impedance at maximum output' represents the load impedance of the peaking amplifier 220 at maximum output, and 'carrier load impedance at maximum output' represents the load impedance of the carrier amplifier 230 at maximum output.

If using the ratio (u) defined in Equation 1 above, a relationship between the load impedance ($Z_p$) of the peaking amplifier 220 and the load impedance ($Z_c$) of the carrier amplifier 230 can be expressed as in Equation 2 below. Here, it is desirable for 'u' to be less than '1'.

$$Z_p = 2 \times R_L = u \times Z_c \quad (2)$$

In Equation 2, '$Z_p$' represents a load impedance of a peaking amplifier 220, '$R_L$' represents a resistance value of an output combination load 330, 'u' represents a ratio of load impedance of the peaking amplifier 220 to load impedance of a carrier amplifier 230 at maximum output, and '$Z_c$' represents a load impedance of the carrier amplifier 230.

In Equation 2 above, the output combination load ($R_L$) 330, the characteristic impedance ($R_\beta$) of the first impedance transformer line 242, and the characteristic impedance ($R_\alpha$) of the second impedance transformer line 244 have a relationship with the output load 250 as in Equation 3 below.

$$R_L = \frac{u}{2} \times R_0$$
$$R_\beta = \sqrt{u} \times R_0 \quad (3)$$
$$R_\alpha = \sqrt{\frac{u}{2}} \times R_0$$

In Equation 3, '$R_L$' represents an output combination load 330, '$R_\beta$' represents a characteristic impedance of a first impedance transformer line 242, '$R_\alpha$' represents a characteristic impedance of a second impedance transformer line 244, '$R_0$' represents an impedance of an output load 250, and 'u' represents a ratio of load impedance of a peaking amplifier 220 to load impedance of a carrier amplifier 230 at maximum output.

Thus, by suitably selecting the ratio 'u' value, and reflecting the 'u' value to set the characteristic impedance ($R_\beta$) of the first impedance transformer line 242 and the characteristic impedance ($R_\alpha$) of the second impedance transformer line 244 as in Equation 3 above, the Doherty amplifier according to an exemplary embodiment of the present invention has a characteristic as illustrated in FIG. 4B. At this time, the ratio 'u' can be different depending on detailed characteristics of respective elements constituting the Doherty amplifier.

Referring back to FIG. 5B, the horizontal axis ($P_{out}$/Peak Capacity) represents a value converting a ratio of a Radio Frequency (RF) output power generated in a Doherty amplifier compared to a sum of available maximum outputs of respective carrier amplifier and peaking amplifier, into a 'dB' unit, and the vertical axis (Drain Efficiency) represents a generated RF output power value compared to a consumed DC power. In FIG. 5B, a high drain efficiency operation region of the Doherty amplifier ranges from 0 dB, which is a maximum output point, to −6 dB. This is possible on the presupposition that a load modulation operation is smoothly performed. If the peaking amplifier and a carrier amplifier were to have the same output load, the peaking amplifier would not reach the maximum output and thus, a load modulation operation would not be smoothly fulfilled. As a result, the Doherty amplifier produces an output smaller than a sum of the available maximum outputs of the respective carrier amplifier and peaking amplifier. Accordingly, the maximum output not only decreases but a high drain efficiency operation region is also reduced.

Figure 6:
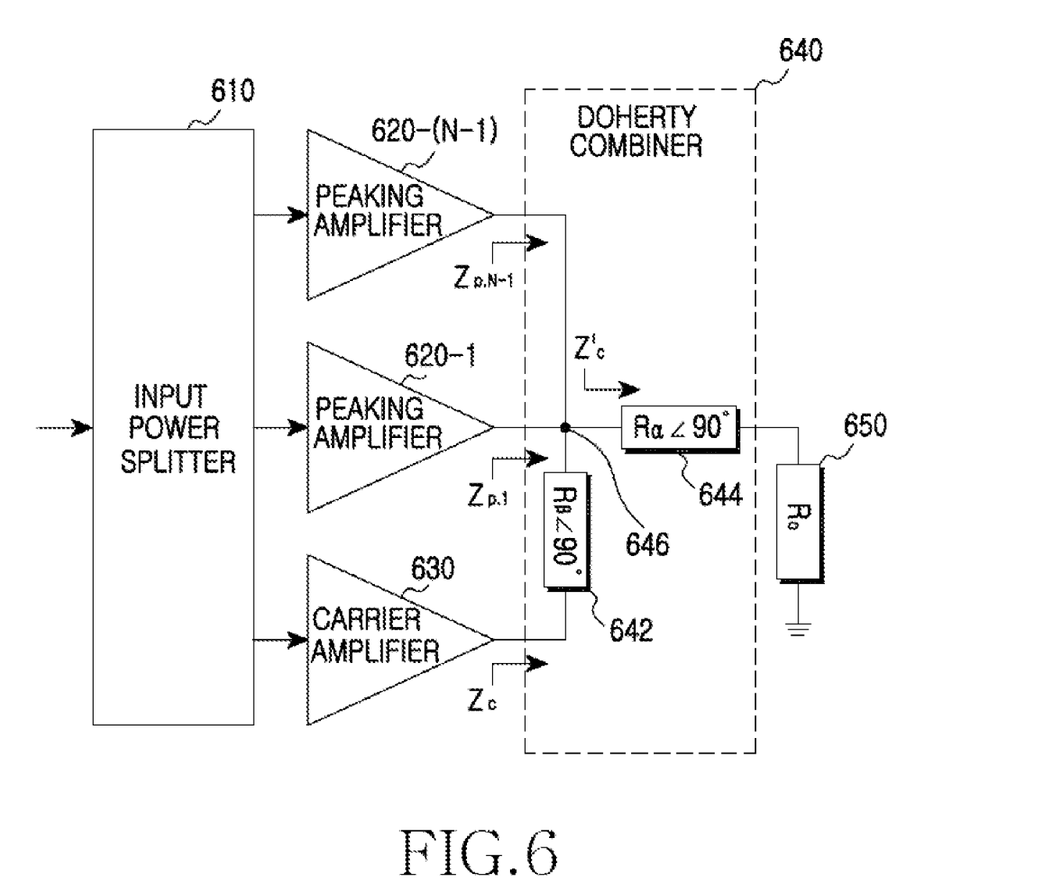
FIG. 6 is a circuit diagram illustrating a structure of an 'N'-way Doherty amplifier according to an exemplary embodiment of the present invention.

Through the aforementioned structure and the setting of the impedance transformer lines, the maximum output of the Doherty amplifier increases. Additionally, for the purpose of increasing the high drain efficiency operation region of FIG. 5B to 6 dB or more, an exemplary embodiment of the present invention proposes a way of using a plurality of peaking amplifiers. That is, an exemplary embodiment of the present invention provides suitable load modulation by arranging the plurality of peaking amplifiers in parallel and inputting a sum of outputs of the plurality of peaking amplifiers to an 'N'-way Doherty combiner. A structure of a Doherty amplifier according to an exemplary embodiment of the present invention is illustrated in FIG. 6. In this case, the Doherty amplifier is operable at high drain efficiency in a region ranging from maximum output to (−20×log(N)) dB.

FIG. 6 illustrates a structure of an 'N'-way Doherty amplifier according to an exemplary embodiment of the present invention.

Referring to FIG. 6, the 'N'-way Doherty amplifier includes an input power splitter 610, a plurality of peaking amplifiers 620-1 to 620-(N−1), a carrier amplifier 630, a Doherty combiner 640, and an output load 650.

The input power splitter 610 splits a signal input to the Doherty amplifier into an 'N' number of power signals each having 1/N power of an input signal power, and provides one of the 'N' number of power signals to each of the peaking amplifiers 620 to 620-(N−1) and the carrier amplifier 630. At this time, among the 'N' number of power signals, one signal applied to the carrier amplifier 630 and an '(N−1)' number of powers signals applied to the plurality of peaking amplifiers 620-1 to 620-(N−1) have phase differences of 90°. For instance, the input power splitter 610 may include at least one of a Wilkinson divider and a coupler. However, when the Wilkinson divider is used as the input power splitter 610, because the Wilkinson divider outputs signals of the same phase, the input power splitter 610 further includes a construction for generating phase differences of 90° between an 'N' number of signals by controlling a phase of one of the 'N' number of signals.

The plurality of peaking amplifiers 620-1 to 620-(N−1) and the carrier amplifier 630 are power amplifiers making use of DC biases. The carrier amplifier 630 uses a higher DC bias than the plurality of peaking amplifiers 620-1 to 620-(N−1). Thus, the minimum value of an input signal power in which the plurality of peaking amplifiers 620-1 to 620-(N−1) operate is higher than the minimum value of an input signal power at which the carrier amplifier 630 operates. That is, if an input signal having power of less than a threshold for operating the plurality of peaking amplifiers 620-1 to 620-(N−1) is applied, only the carrier amplifier 630 operates. In this case, the plurality of peaking amplifiers 620-1 to 620-(N−1) are in a state corresponding to an open circuit. Here, output terminals of the plurality of peaking amplifiers 620-1 to 620-(N−1) are all connected with each other at a node A 646.

The Doherty combiner 640 forms a load impedance of the peaking amplifier 620 and the carrier amplifier 630 using a first impedance transformer line 642 having a characteristic impedance of $R_\beta \angle 90°$ and a second impedance transformer line 644 having a characteristic impedance of $R_\alpha \angle 90°$. The output load 650 outputs an amplified signal, and has an impedance of $R_0$.

In a description of a detailed construction of the Doherty combiner 640, the first impedance transformer line 642 connects with an output terminal of the carrier amplifier 630, and the second impedance transformer line 644 connects with the output terminals of the peaking amplifiers 620-1 to 620-(N−1). The first impedance transformer line 642 and the second impedance transformer line 644 connect with each other through the node A 646, which is disposed at the output terminal of the peaking amplifiers 620-1 to 620-(N−1). The load impedance values of the peaking amplifiers 620-1 to 620-(N−1) and the carrier amplifier 630, which are formed by the Doherty combiner 640, are varied according to states of the peaking amplifiers 620-1 to 620-(N−1). At a low output, a load impedance ($Z_c$) of the carrier amplifier 630 becomes 'N' times an impedance ($R_0$) of the output load 650 and, at maximum output, the load impedance ($Z_c$) of the carrier amplifier 630 is equal to the impedance ($R_0$) of the output load 650 and simultaneously load impedance ($Z_{p,1}$ to $Z_{p,N-1}$) of the peaking amplifiers 620-1 to 620-(N−1) is less than the load impedance ($Z_c$) of the carrier amplifier 630. Here, a characteristic impedance ($R_\beta$) of the first impedance transformer line 642 should be set to less than the impedance ($R_0$) of the output load 650, and a characteristic impedance ($R_\alpha$) of the second impedance transformer line 644 should be set to less than a value obtained by dividing the impedance ($R_0$) of the output load 650 by $\sqrt{N}$. This is because an impedance of a combination load should be equal to $R_0/N$ such that, as a result of load modulation at high output, the load impedance ($Z_c$) of the carrier amplifier 630 including the first impedance transformer line 642 is equal to the '$R_0$'. For instance, the characteristic impedance ($R_\beta$) of the first impedance transformer line 642 and the characteristic impedance ($R_\alpha$) of the second impedance transformer line 644 can be determined as in Equation 4 below.

$$R_\beta = \sqrt{u} \times R_0 \qquad (4)$$

$$R_\alpha = \sqrt{\frac{u}{N}} \times R_0$$

In Equation 4, '$R_\beta$' represents a characteristic impedance of a first impedance transformer line 642, '$R_\alpha$' represents a characteristic impedance of a second impedance transformer line 644, '$R_0$' represents an impedance of an output load 650, 'u' represents a ratio of load impedance of peaking amplifiers 620-1 to 620-(N−1) to load impedance of a carrier amplifier 630 at maximum output, and 'N' represents a sum of the number of a plurality of peaking amplifiers 620-1 to 620-(N−1) and the number of carrier amplifier 630.

According to an exemplary embodiment of the present invention, the Doherty combiner 640 may replace the first impedance transformer line 642 and the second impedance transformer line 644 with 'T' or 'Pi' circuits. That is, the first impedance transformer line 642 and second impedance transformer line 644 of the Doherty combiner 640 may include at least one of a resistor, an inductor, and a capacitor.

By giving asymmetric load impedance to a carrier amplifier and a peaking amplifier in a Doherty amplifier, exemplary embodiments of the present invention induce the maximum output of each of the carrier amplifier and the peaking amplifier. Due to the asymmetric load impedance, the performance of the Doherty amplifier is improved.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A Doherty amplifier apparatus, the apparatus comprising:
   a splitter for splitting an input signal into an N number of power signals, wherein the N is equal to an integer of 2 or more;
   a carrier amplifier for amplifying the signal provided from the splitter using a first Direct Current (DC) bias;
   an (N−1) number of peaking amplifiers for amplifying the signals provided from the splitter using a second DC bias, which is lower than the first DC bias;
   a Doherty combiner for, when the carrier amplifier and the (N−1) number of peaking amplifiers are all operating, forming a load impedance of the respective amplifiers such that the load impedance of the (N−1) number of peaking amplifiers are less than the load impedance of the carrier amplifier; and
   an output load for outputting the signals amplified by the carrier amplifier and the (N−1) number of peaking amplifiers.

2. The apparatus of claim 1, wherein the Doherty combiner forms the load impedance of the respective amplifiers such that outputs of the carrier amplifier and the (N−1) number of peaking amplifiers are maximized.

3. The apparatus of claim 1, wherein the Doherty combiner comprises:
   a combination node for connecting with output terminals of the (N−1) number of peaking amplifiers;
   a first impedance transformer line disposed between the combination node and an output terminal of the carrier amplifier; and a second impedance transformer line disposed between the combination node and the output load.

4. The apparatus of claim 3, wherein a characteristic impedance of the second impedance transformer line is less than a value obtained by dividing an impedance of the output load by $\sqrt{N}$.

5. The apparatus of claim 4, wherein a characteristic impedance of the first impedance transformer line is less than the impedance of the output load.

6. The apparatus of claim 5, wherein the characteristic impedance of the first impedance transformer line and the characteristic impedance of the second impedance transformer line are determined as:

$$R_\beta = \sqrt{u} \times R_0$$
$$R_\alpha = \sqrt{\frac{u}{N}} \times R_0$$

where,
$R_\beta$ denotes a characteristic impedance of a first impedance transformer line,
$R_\alpha$ denotes a characteristic impedance of a second impedance transformer line,
$R_0$ denotes an impedance of an output load,
u denotes a ratio of load impedance of a peaking amplifier to load impedance of a carrier amplifier at maximum output, and
N denotes a sum of the number of a plurality of peaking amplifiers and the number of carrier amplifiers.

7. The apparatus of claim 4, wherein the first impedance transformer line and the second impedance transformer line have phase values of 90°.

8. The apparatus of claim 7, wherein the splitter generates phase differences of 90° between the signal provided to the carrier amplifier and the signals provided to the (N−1) number of peaking amplifiers.

9. The apparatus of claim 8, wherein the splitter comprises one of a coupler and a Wilkinson divider.

10. The apparatus of claim 1, wherein the Doherty combiner comprises at least one of a resistor, an inductor, and a capacitor.

11. The apparatus of claim 1, wherein the forming of the load impedance of the respective amplifiers when the carrier amplifier and the (N−1) number of peaking amplifiers are all operating includes forming a load impedance of the respective amplifiers such that the load impedance of the carrier amplifier is equal to the impedance of the output load and load impedance of the (N−1) number of peaking amplifiers are less than the load impedance of the carrier amplifier.

12. The apparatus of claim 1, further comprising, when the carrier amplifier is operating and the (N−1) number of peaking amplifiers are not operating, forming the load impedance of the carrier amplifier to be N times the impedance of the output load.

13. An operation method of a Doherty amplifier, the method comprising:
splitting an input signal into an N number of power signals, wherein the N is equal to an integer of 2 or more;
amplifying one of the split signals through a carrier amplifier, which operates using a first Direct Current (DC) bias;
amplifying an (N−1) number of split signals through an (N−1) number of peaking amplifiers, which operate using a second DC bias lower than the first DC bias;
when the carrier amplifier and the (N−1) number of peaking amplifiers are all operating, forming a load impedance of the respective amplifiers such that the load impedance of the (N−1) number of the peaking amplifiers are less than the load impedance of the carrier amplifier; and
outputting the signals, which are amplified by the carrier amplifier and the (N−1) number of peaking amplifiers, through an output load.

14. The method of claim 13, wherein the forming of the load impedance of the respective amplifiers comprises forming the load impedance of the respective amplifiers such that outputs of the carrier amplifier and the (N−1) number of peaking amplifiers are maximized.

15. The method of claim 14, wherein the forming of the load impedance is carried out by the Doherty combiner, and wherein the Doherty combiner comprises:
a combination node connecting with output terminals of the (N−1) number of peaking amplifiers;
a first impedance transformer line disposed between the combination node and an output terminal of the carrier amplifier; and
a second impedance transformer line disposed between the combination node and the output load.

16. The method of claim 15, wherein a characteristic impedance of the second impedance transformer line is less than a value obtained by dividing an impedance of the output load by $\sqrt{N}$.

17. The method of claim 16, wherein a characteristic impedance of the first impedance transformer line is less than the impedance of the output load.

18. The method of claim 17, wherein the characteristic impedance of the first impedance transformer line and the characteristic impedance of the second impedance transformer line are determined as:

$$R_\beta = \sqrt{u} \times R_0$$
$$R_\alpha = \sqrt{\frac{u}{N}} \times R_0$$

where,
$R_\beta$ denotes characteristic impedance of a first impedance transformer line,
$R_\alpha$ denotes characteristic impedance of a second impedance transformer line,
$R_0$ denotes impedance of an output load,
u denotes ratio of load impedance of a peaking amplifier to load impedance of a carrier amplifier at maximum output, and
N denotes sum of the number of a plurality of peaking amplifiers and the number of carrier amplifiers.

19. The method of claim 16, wherein the first impedance transformer line and the second impedance transformer line have phase values of 90°.

20. The method of claim 19, wherein the signal provided to the carrier amplifier and the signals provided to the (N−1) number of peaking amplifiers have phase differences of 90°.

21. The method of claim 20, wherein the splitting of the input signal is performed through one of a coupler and a Wilkinson divider.

22. The method of claim 13, wherein the forming of the load impedance is carried out through the Doherty combiner that comprises at least one of a resistor, an inductor, and a capacitor.

23. The method of claim 13, wherein the forming of the load impedance of the respective amplifiers when the carrier amplifier and the (N−1) number of peaking amplifiers are all operating includes forming a load impedance of the respective amplifiers such that the load impedance of the carrier amplifier is equal to the impedance of the output load and load impedance of the (N−1) number of peaking amplifiers are less than the load impedance of the carrier amplifier.

24. The method of claim 13, wherein when the carrier amplifier is operating and the (N−1) number of peaking amplifiers are not operating, the load impedance of the carrier amplifier is formed to be N times the impedance of the output load.

* * * * *